(12) United States Patent
Kim (10) Patent No.: US 8,227,824 B2
(45) Date of Patent: Jul. 24, 2012

(54) LIGHT EMITTING DEVICE PACKAGE

(75) Inventor: Geun Ho Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 241 days.

(21) Appl. No.: 12/647,881

(22) Filed: Dec. 28, 2009

(65) Prior Publication Data

US 2010/0163905 A1    Jul. 1, 2010

(30) Foreign Application Priority Data

Dec. 29, 2008   (KR) .................. 10-2008-0135988

(51) Int. Cl.
  *H01L 33/00* (2010.01)
(52) U.S. Cl. .................. 257/98; 257/E33.061
(58) Field of Classification Search .......... 257/98, 257/E33.061
  See application file for complete search history.

(56) References Cited

U.S. PATENT DOCUMENTS

| | | |
|---|---|---|
| 2004/0135156 A1 | 7/2004 | Takenaka |
| 2005/0230692 A1 | 10/2005 | Kim et al. |
| 2007/0018175 A1 | 1/2007 | Mazzochette et al. |
| 2008/0006837 A1 | 1/2008 | Park et al. |
| 2008/0128723 A1* | 6/2008 | Pang ................ 257/98 |
| 2008/0149373 A1 | 6/2008 | Kim et al. |
| 2009/0278153 A1 | 11/2009 | Cho |
| 2010/0012967 A1 | 1/2010 | Choi et al. |
| 2010/0032705 A1* | 2/2010 | Shin et al. ............ 257/99 |
| 2011/0278637 A1 | 11/2011 | Kim et al. |

FOREIGN PATENT DOCUMENTS

| | | |
|---|---|---|
| CN | 1684281 A | 10/2005 |
| EP | 1 587 151 A2 | 10/2005 |
| EP | 1 876 653 A2 | 1/2008 |
| EP | 1 937 041 A2 | 6/2008 |
| JP | 2006-303396 A | 11/2006 |
| JP | 2007-67452 A | 3/2007 |
| JP | 2007-250979 A | 9/2007 |
| KR | 10-2006-0080336 A | 7/2006 |
| WO | WO 2008/078900 A1 | 7/2008 |

* cited by examiner

*Primary Examiner* — Ha Tran T Nguyen
*Assistant Examiner* — Shaun Campbell
(74) *Attorney, Agent, or Firm* — Birch, Stewart, Kolasch & Birch, LLP (57) ABSTRACT

A light emitting device package and a method for manufacturing the same are provided. The light emitting device package comprises a package body including a cavity disposed at an upper portion. The light emitting device package includes an insulating layer disposed on a surface of the package body. The light emitting device package includes a plurality of metal layers disposed on the insulating layer. The light emitting device package includes a light emitting device disposed in the cavity. The light emitting device package includes a first metal plate disposed at a rear surface of the package body at a location corresponding to the light emitting device.

20 Claims, 7 Drawing Sheets

LIGHT EMITTING DEVICE PACKAGE

CROSS-REFERENCE TO RELATED APPLICATIONS

The present application claims priority under 35 U.S.C. 119 to Korean Patent Application No. 10-2008-0135988 filed on Dec. 29, 2008, which is hereby incorporated by reference in its entirety.

BACKGROUND

Embodiments of the invention relate to a light emitting device package.

A light emitting diode (LED) may constitute a light emitting source, and may use compound semiconductor materials such as GaAs-based materials, AlGaAs-based materials, GaN-based materials, InGaN-based materials and InGaAlP-based materials.

Such an LED is packaged, and thereby is being used as a light emitting device for emitting various color lights. The light emitting device is being used as a light source in various fields, for example, lighting display devices, character display devices and image display devices.

SUMMARY

Embodiments of the invention provide a light emitting device package in which a thermal resistance is improved.

Embodiments of the invention provide a light emitting device package in which a heat-radiating path of a light emitting device is improved.

An embodiment of the invention provides a light emitting device package including a package body comprising a cavity disposed at an upper portion; an insulating layer disposed on a surface of the package body; a plurality of metal layers disposed on the insulating layer; a light emitting device disposed in the cavity; and a first metal plate disposed on a rear surface of the package body at a location corresponding to the light emitting device.

An embodiment of the invention provides a light emitting device package including a package body having a cavity; a plurality of metal layers disposed on the package body; an insulating layer disposed between the plurality of metal layers and the package body; at least one well formed in the package body; a light emitting device disposed on the package body in the cavity; and a first metal plate disposed under the package body at a region corresponding to the light emitting device An embodiment of the invention provides a light emitting device package including a package body having a cavity, and formed of a silicon material; at least one light emitting device disposed in the cavity of the package body; and a first metal plate disposed at a region corresponding to a region of the light emitting device at an under surface of the package body.

The details of one or more embodiments of the invention are set forth in the accompanying drawings and the description below. Other features will be apparent from the description and drawings, and from the claims.

DETAILED DESCRIPTION OF THE EMBODIMENTS

Reference will now be made in detail to the embodiments of the invention, examples of which are illustrated in the accompanying drawings. In description of embodiments, the 'on' or 'under' of each layer may be described with reference to the accompanying drawings, and the thickness of the each layer will also be described as an example and is not limited to the thickness of the accompanying drawings.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings. Also, the thickness of each layer in the drawings is an example, and is not limited thereto.

Figure 1:
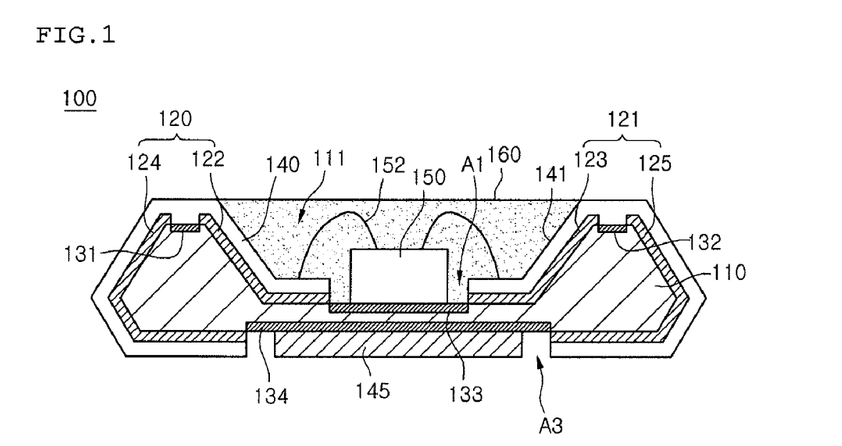
FIG. 1 is a cross-sectional view illustrating a light emitting device package according to a first embodiment.

FIG. 1 is a cross-sectional view illustrating a light emitting device package according to a first embodiment. Referring to FIG. 1, a light emitting device package 100 includes a package body 110, insulating layers 120 and 121, a plurality of wells (or doped regions) 131 to 134, first and second metal layers 140 and 141, a metal plate 145, and a light emitting device 150.

The package body 110 may be formed with a conductive substrate or a Wafer Level Package (WLP) using a silicon material. A cavity 111 having a certain depth is formed at the upper portion of the package body 110. The cavity 111 may be formed as any one of a concave base tube shape, a concave polygonal shape and a concave circular shape. Other shapes are within the scope of the invention.

The side surface of the cavity 111 of the package body 110 may be formed to be inclined, to be vertical at a certain angle, to have a certain curvature, or to have a step, for example. The perimeter of the top of the package body 110 may be formed to be flat, and the outside surfaces of the package body 110 may be formed to be bent at a certain angle, formed to be inclined, to be vertical at a certain angle, to have a certain curvature, or to have a step, for example.

The insulating layers 120 and 121 are formed on a surface of the package body 110. The insulating layers 120 and 121 may be formed of at least one of insulating material or dielectric materials such as silicon thermal oxide, silicon carbide (SiC), aluminum nitride (AlN), alumina and silicon nitride. Herein, the insulating layers 120 and 121 may be formed of the silicon thermal oxide for forming a Zener diode structure in the package body 110.

In the package body 110, the region between the cavity 111 and the rear surface of the package body 110 may be formed to have a minimum thickness. The thickness between the bottom of the cavity 111 and the rear surface of the package body 110, for example, is about 500 um to about 2000 um. The thickness may be altered according to heat transfer efficiency without causing the breakage of a silicon wafer.

In the first insulating layer 120, a 1Ath insulating layer 122 and a 1Bth insulating layer 124 are integrally formed on an inclined side of the package body 110 in the cavity 111 and an inclined outside surface of the package body 110, respectively. Herein, the 1Bth insulating layer 124 extends on the inclined outside surface and a portion of the under surface of the package body 110. The side of the package body 110 having the first insulating layer 120 may be referred to as a first side of the package body 110.

In the second insulating layer 121, a 2Ath insulating layer 123 and a 2Bth insulating layer 125 are integrally formed on an inclined side of the package body 110 in the cavity 111 and an inclined outside surface of package body 110 on the other side of the package body 110 from the first insulating layer 120. Herein, the 2Bth insulating layer 125 extends on the inclined outside surface and a portion of the rear surface of the package body 110 on the other side of the package body 110 from the first insulating layer 120. The side of the package body 110 having the second insulating layer 121 may be referred to as a second side of the package body 110.

The first and second insulating layers 120 and 121 may be integrally formed at a region other than an open region A1 of the bottom of the cavity 111 and an open region A3 of the rear surface of the package body 110, or may be disposed under the first and second metal layers 140 and 141.

The wells (or doped regions) 131 to 134 are formed at certain regions of the package body 110, respectively. A first well 131 is formed at the first side of the package body 110, and a second well 132 is formed at the second side of the package body 110. A third well 133 is formed at the cavity 111 of the package body 110, and a fourth well 134 is formed at the rear surface of the package body 110.

The first well 131 is formed in the package body 110 at an open region (or an opening) of the first insulating layer 120, and the second well 132 is formed in the package body 110 at an open region (or an opening) of the second insulating layer 121. The first and second wells 131 and 132 may be formed by diffusing or injecting impurities into the package body 110. The diffused or injected impurities have a polarity that is opposite to the polarity of the package body 110, for example, the polarity of a silicon substrate. The first and second wells 131 and 132 may be realized as (or used in) Zener diodes that are formed in the package body 110.

The third well 133 is disposed at the bottom of the cavity 111, and the fourth well 134 is formed at the under surface of the opposite side of the third well 133. The third and fourth well 133 and 134 may also be formed by diffusing or injecting the same types of impurities as the first and second wells 131 and 132 into the package body 110.

The third well 133 is formed at the package body 110 that is exposed at the open region A1 of a center portion of the cavity 111, and the fourth well 134 is formed at the package body 110 that is exposed at the open region A3 of the rear surface of the package body 110. The third well 133 or/and the fourth well 134 is/are electrically insulated from the light emitting device 150 (i.e., a floating state), and thus may be realized as a constant-current transistor and a Zener diode for other device protection. In embodiments of the invention, the first and second insulating layers 120 and 121 may be a single continuous or contiguous insulating layer that covers the entire surface or most of the surface of the package body 110, which may be formed with a conductive substrate or a Wafer Level Package (WLP) using the silicon material. In the single continuous insulating layer, one or more openings may be formed for use in forming the wells (i.e., the doped regions) in the package body 110.

The first and second metal layers 140 and 141 having certain patterns are formed on the first and second insulating layers 120 and 121, respectively. Moreover, the first and second metal layers 140 and 141 are electrically insulated from each other, for example, by the open regions A1 and A3 of the package body 110, and are formed at a region of the cavity 111 and a portion of each of the top, side and under surfaces of the package body 110. Accordingly, where the first and second metal layers 140 and 141 are divided, an underlying portion of the insulating layer (e.g., 120 and 121) may be exposed.

The first and second metal layers 140 and 141 each may be formed as a single layer or multi-layers of metal by using at least one of copper (Cu), nickel (Ni), gold (Au) and titanium (Ti), but they are not limited thereto.

The first and second metal layers 140 and 141 may be used as two electrode leads, and the number of the leads may be varied according to a metal-layer pattern.

A portion of the first metal layers 140 is formed on the first well 131 and thereby is electrically connected to the first well 131. The second metal layer 141 is formed on the second well 132 and thereby is electrically connected to the second well 132.

The light emitting device 150 is mounted within the cavity 111 of the package body 110. At least one chip or at least one kind of chip may be mounted on the light emitting device 150. The light emitting device 150 is attached to the bottom (i.e., the surface of the package body) of the cavity 111. For example, the light emitting device 150 may be a colored LED chip such as a blue LED chip, a green LED chip, a red LED chip and/or a yellow LED chip, or may be an ultraviolet (UV) LED chip. The kind and number of the light emitting device 150, however, are not limited thereto.

Herein, the light emitting device 150 may be attached onto the third well 133 that is formed at the open region A1 of the cavity 111 of the package body 110.

The first and second metal layers 140 and 141 and the light emitting device 150 are electrically connected with a plurality wires 152. The package body 110 may be solder-bonded to a base substrate (for example, MOPCB) at the under and side surfaces thereof using Surface Mount Technology (SMT).

Herein, the first and second wells 131 and 132 are connected to the light emitting device 150 in parallel, or the first and second wells 131 and 132 and the light emitting device 150 may be formed as independent devices, according to the patterns of the first and second metal layers 140 and 141.

The third metal plate 145 is formed at the open region A3 of the rear surface of the package body 110. The third metal plate 145 may be formed of the same material as that of the first and second metal layers 140 and 141, or may be formed of another metal material having good heat radiation characteristic. The third metal plate 145 is formed at a region facing the bottom of the light emitting device 150, for example, under the fourth well 134. The third metal plate 145 radiates heat that is produced from the light emitting device 150. For this, the third metal plate 145 may be effective for radiating heat when its size is formed to be greater than the contact-surface area of the light emitting device 150. The thickness of the third metal plate 145 may be formed to about 0.5 um to about 100 um, but it is not limited thereto.

As shown in FIG. 1, the light emitting device 150 and the third metal plate 145 are place on opposing surfaces of the package body 110. The contact area of the light emitting device 150 on the package body 110 is smaller than a contact area of the third metal plate 145 on the package body 110, but is not limited thereto. The light emitting device 150 and the third metal plate 145 are place on opposing surfaces of a thinnest part of the package body 110.

The third metal plate 145 and the under surface of the package body 110 may be formed on the same plane. The third metal plate 145 is disposed in a structure where it is electrically opened to the first and second metal layers 140 and 141.

A resin material 160 is formed at the cavity 111. The resin material 160 may be formed of a transparent resin material such as silicon or an epoxy. Moreover, at least one kind of phosphor may be contained to the resin material 160, but is not limited thereto.

When a power source is attached, and power (e.g., current) is supplied through the first and second metal layers 140 and 141, the light emitting device 150 receives the power through the wire 152, which is connected to the first and second metal layers 140 and 141, to emit light.

When heat is produced by driving of the light emitting device 150, a portion of the heat is conducted to the third metal plate 145 through the package body 110 beneath the light emitting device 150, and is thereby radiated. At this point, because the thickness of a region at which the third metal plate 145 is formed is thin, the package body 110 can effectively conduct heat. The heat is purposely conducted through the thin region of the package body 110 to the third metal place 145 because the heat transferred to parts of the package body other than where the third metal place 145 is located will not effectively radiate due to the presence of the insulating layers 120 and 121.

Figure 2A:
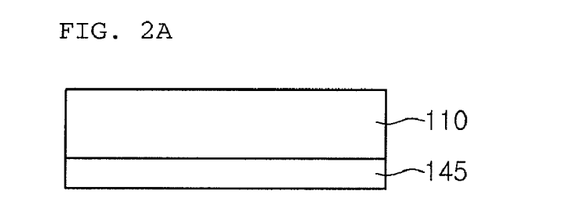
FIGS. 2A and 2B are diagrams respectively illustrating a heat-radiating path and a heat-radiating resistor corresponding to the light emitting device package in FIG. 1.
Figure 2B:
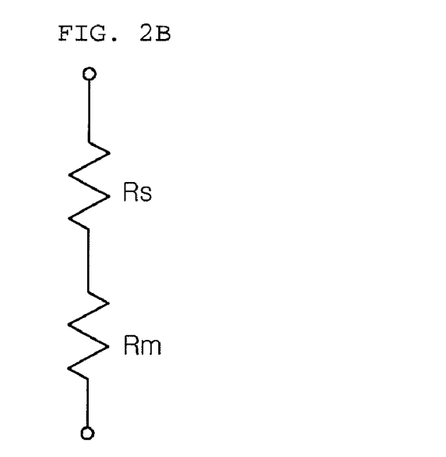

FIGS. 2A and 2B are diagrams respectively illustrating a heat-radiating path and a heat-radiating resistor of FIG. 1. Referring to FIGS. 1 and 2A, heat produced in the light emitting device 150 is transferred through the package body 110 and the third metal plate 145 that are disposed underneath the light emitting device 150 and is thereby radiated. That is, the heat produced in the light emitting device 150 is transferred through the package body 110 and the third metal plate 145 and is thereby radiated to the outside. As illustrated in FIG. 2B, the resistor Rs of the package body 110 and the resistor Rm of the third metal plate 145 are connected as the thermal resistors of the semiconductor emitting device package. The heat of the light emitting device 120 can be quickly radiated by the thermal resistors Rs and Rm. This reduces the number of the thermal resistors Rs and Rm that are disposed at the vertical down direction of the light emitting device 150, and thus a high-efficiency package can be manufactured. Accordingly, the light emitting device 150 stably operates, improving light emission efficiency.

Figure 3:
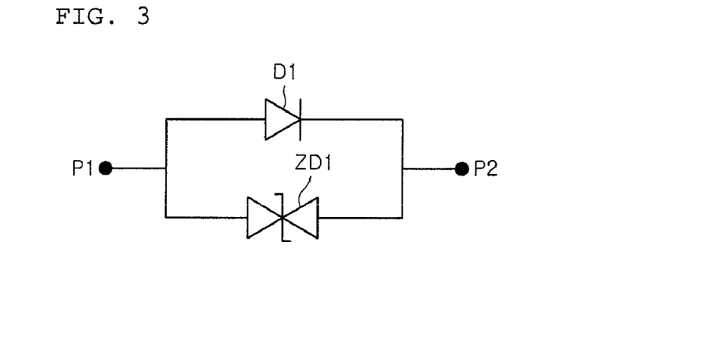
FIG. 3 is a circuit diagram illustrating an example of the equivalent circuit of the light emitting device package in FIG. 1.

FIG. 3 is a circuit diagram illustrating an example of the equivalent circuit of the light emitting device package in FIG. 1.

Referring to FIG. 3, the light emitting device package includes a light emitting diode D1 and a Zener diode ZD1. The light emitting diode D1 and the Zener diode ZD1 may be connected in parallel. First and second electrodes P1 and P2 are connected to opposite ends of the light emitting diode D1 and the Zener diode ZD1, respectively.

Although the Zener diode ZD1 has been disclosed as a bi-directional Zener diode having a bi-directional threshold voltage, a uni-directional Zener diode having a uni-directional threshold voltage may be connected to the light emitting diode D1 in anti-parallel, and it may be selectively used within the spirit and scope of the above-described technology. In embodiments of the invention, anti-parallel or inverse-parallel refers to an arrangement of devices that are connected in parallel but with their polarities reversed.

Figure 4:
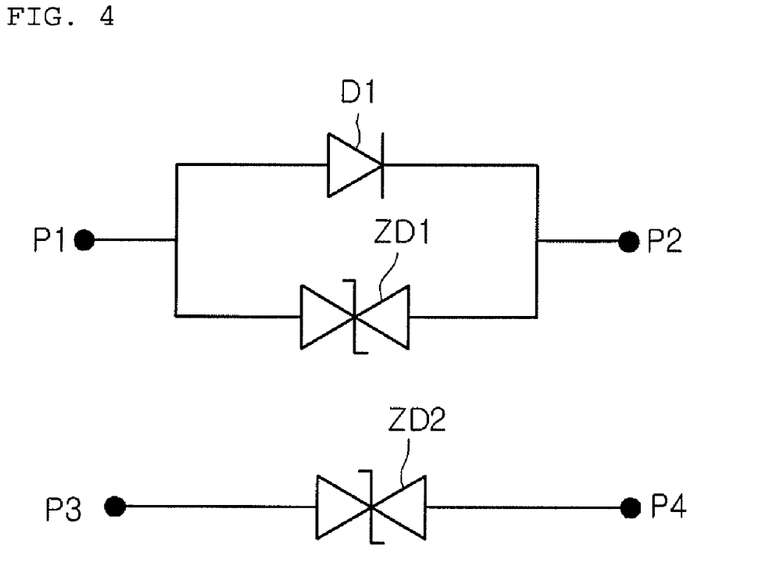
FIG. 4 is a circuit diagram illustrating another example of the equivalent circuit of the light emitting device package in FIG. 1.

FIG. 4 is a circuit diagram illustrating another example of the equivalent circuit of the light emitting device package in FIG. 1. Referring to FIG. 4, the light emitting device package includes a light emitting diode D1, a first Zener diode ZD1, and a second Zener diode ZD2. The light emitting diode D1 and the first Zener diode ZD1 may be connected in parallel, and the second Zener diode ZD2 is configured as a circuit that differs from the first Zener diode ZD1. That is, the first and second wells 131 and 132 in FIG. 1 may be realized as the first Zener diode ZD1, and the third and fourth wells 133 and 134 in FIG. 1 may be realized as the second Zener diode ZD2.

Figure 5:
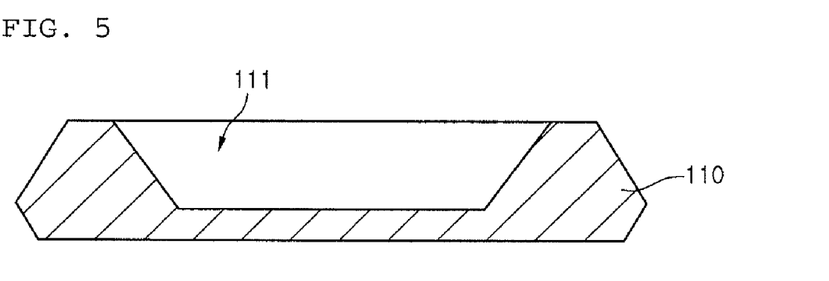
FIGS. 5 to 11 are diagrams illustrating a method for manufacturing the light emitting device package in FIG. 1.

FIGS. 5 to 11 are diagrams illustrating a method for manufacturing the light emitting device package in FIG. 1. Referring to FIG. 5, the package body 110 may be formed with a conductive substrate or a WLP using a silicon material. The cavity 111 having a certain depth is formed at the upper portion of the package body 110.

A mask pattern is formed on and under the package body 110 and the cavity 111 may be formed through an etching process. The etching process may use a wet etching process or a dry etching process.

The surface of cavity 111 may be formed as a concave base tube shape, a concave polygonal shape or a concave circular shape, but is not limited thereto. The side surface of the cavity 111 may be formed to be inclined, to be vertical at a certain angle, to be at a certain curvature, or to have a step, for example. The perimeter of the top of the package body 110 may be formed to be flat, and the opposite side surfaces of the package body 110 may be formed to be bent at a certain angle.

In the package body 110, the region between the cavity 111 and the under surface of the package body 110 may be formed to a minimum thickness of the package body 110. The thickness between the bottom of the cavity 111 and the under surface of the package body 110, for example, is about 500 um to about 2000 um. The thickness may be altered according to heat transfer efficiency without causing breakage of a silicon wafer (the package body 110).

Figure 6:
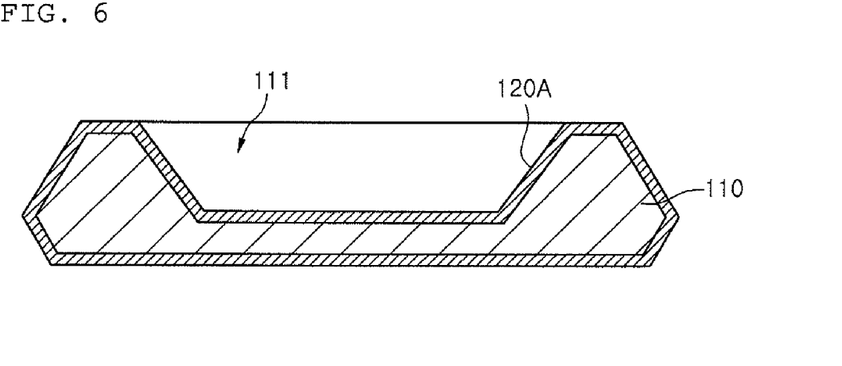

Referring to FIG. 6, an insulating layer 120A is formed on the entire surface of the package body 110, but is not limited thereto. The insulating layer 120A may be formed of at least one of dielectric materials, such as silicon thermal oxide, SiC, AlN, alumina and silicon nitride, or may use a dielectric material that is used in a silicon semiconductor process. When a Zener diode is realized at the package body 110, the insulating layer 120A may be used as a silicon thermal oxide.

Figure 7:
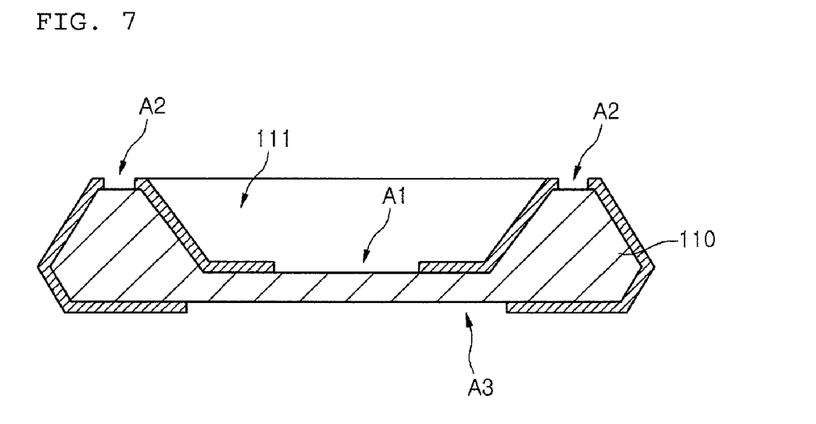
Figure 8:
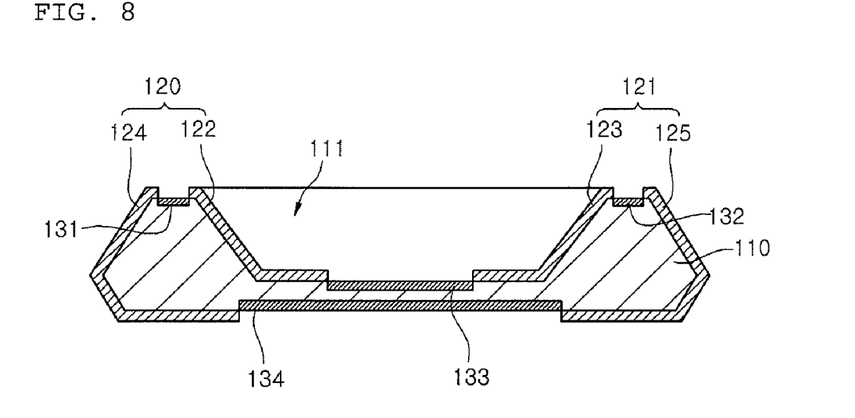

Referring to FIGS. 6 to 8, a patterning process is performed on the insulating layer 120A. By forming the open region A1 of the cavity 111 and the both-side well open region A2 and rear-surface open region A3 of the package body 110 through the patterning process via removal of portions of the insulating layer 120A, the insulating layer 120A is opened. Accordingly, the insulating layer 120A may be disposed as the first and second insulating layers 120 and 121 by the patterning process. Herein, the first and second insulating layers 120 and 121 may be integrally formed or may be disposed in a divided structure.

In the first insulating layer 120, the 1Ath insulating layer 122 and the 1Bth insulating layer 124 are integrally formed at the one side (the first side) of the cavity 111 of the package body 110 and the one side (the first side) of the body of the package body 110. Herein, the 1Bth insulating layer 124 is extended to the one-side (the first side) surface of the package body 110 and a portion of the rear surface of the package body 110.

In the second insulating layer 121, the 2Ath insulating layer 123 and the 2Bth insulating layer 125 are integrally formed at the other side (the second side) of the cavity 111 of the package body 110 and the other side (the second side) of the body of the package body 110. Herein, the 2Bth insulating layer 125 is extended to the other-side (the second side) surface of the package body 110 and a portion of the under surface of the package body 110.

The first and second insulating layers 120 and 121 may be integrally formed at a region other than the open region A1 of the bottom of the cavity 111 and the open region A3 of the rear surface of the package body 110, or may be divided in plurality.

Referring to FIGS. 7 and 8, a diffusion process is performed on the open regions A1 to A3 from which the insulating layers 120 and 121 has been removed. The diffusion process is a process that diffuses impurities into the package body 110 through the open regions A1 to A3, wherein the impurities opposite to the polarity of a silicon substrate are injected or doped. Accordingly, the first to fourth wells (or doped regions) 131 to 134 are formed at the package body 110 of the open regions A1 to A3.

The first well 131 is formed at the one-side (the first side) open region A2 of the package body 110, and the second well 132 is formed at the other-side (the second side) open region A2 of the package body 110. The third well 133 is formed at the open region A1 of the cavity 111 of the package body 110, and the fourth well 134 is formed at the rear-surface open region A3 of the package body 110.

The first and second wells 131 and 132 may be realized as Zener diodes, and the third and fourth wells 133 and 134 may be realized as Zener diodes for other device protection. The third well 133 or/and the fourth well 134 is/are electrically insulated from the light emitting device 150 (i.e., a floating state), and thus may be realized as a constant-current transistor and a Zener diode for other device protection.

Figure 9:
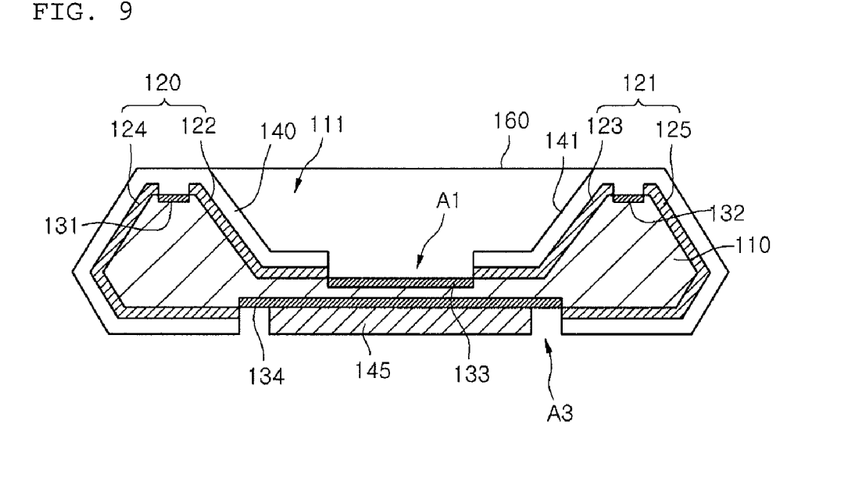

Referring to FIGS. 8 and 9, a metal forming process is performed. The first and second metal layers 140 and 141 and the third metal plate 145 are formed using a mask pattern in a sputtering process or a thin film deposition process, but is not limited thereto. The first and second metal layers 140 and 141 are formed on the insulating layers 120 and 121, and the third metal plate 145 is formed at the under-surface open region A3 of the package body 110.

The first and second metal layers 140 and 141 are electrically opened, and are extended to the region of the cavity 111 and a portion of the side surface and under surface of the package body 110. The third metal plate 145 may serve as an under-surface heat radiating plate.

Herein, the first and second metal layers 140 and 141 may be used as at least two electrode leads, and the number of the leads may be varied according to a metal-layer pattern.

The first and second metal layers 140 and 141 and the third metal plate 145 may be formed in the same process and may be formed as single layers or multi layers by using at least one of Cu, Ni, Au and Ti, but they are not limited thereto.

The third metal plate 145 is formed under the fourth well 134. For example, when the size of the third metal plate 145 is formed to greater than the contact-surface area of the light emitting device 150, the third metal plate 145 may be effective for radiating heat. The thickness of the third metal plate 145 may be formed to about 0.5 um to about 100 um, but it is not limited thereto.

The first and second metal layers 140 and 141 are formed on the first and second wells 131 and 132, and are electrically connected to the first and second wells 131 and 132.

Figure 10:
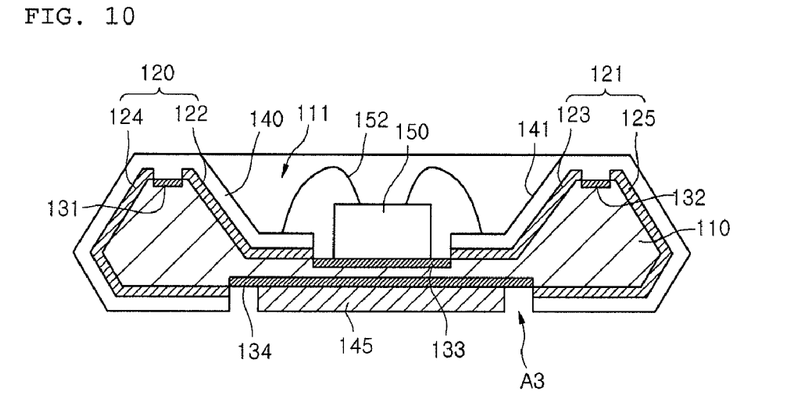

Referring to FIGS. 9 and 10, a process is performed which mounts the light emitting device 150. The light emitting device 150 is attached in the cavity 111 of the package body 110. At least one the light emitting 150 may be disposed on the third well 133. The light emitting device 150 is electrically connected to the first and second metal layers 140 and 141 through the plurality of wires 152, but such a connection scheme is not limited thereto.

The light emitting device 150 may be a colored LED chip such as a blue LED chip, a green LED chip, a red LED chip and/or a yellow LED chip, or may be realized as an ultraviolet (UV) LED chip. The kind and number of the light emitting device 150, however, are not limited thereto.

Herein, the first and second wells 131 and 132 and the light emitting device 150 may be formed as a parallel circuit or may be formed as independent circuits, according to the patterns of the first and second metal layers 140 and 141.

Figure 11:
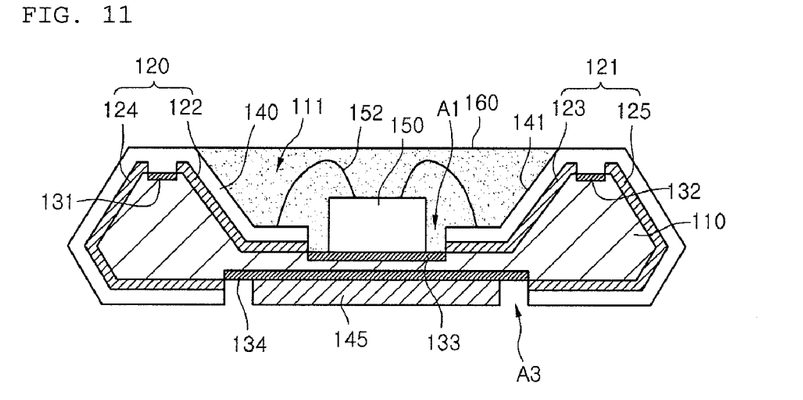

Referring to FIGS. 10 and 11, the resin material 160 is formed in the cavity 111. The resin material 160 may be formed of a transparent resin material such as silicon or an epoxy, or at least one kind of phosphor may be contained to the resin material 160. A lens may be formed or is attached on the cavity 111, but is not limited thereto.

The first and second metal layers 140 and 141 may be solder bonded to a base substrate (for example, MOPCB) at the under and side surfaces of the package body 110 in SMT.

When heat is produced by driving of the light emitting device 150, a portion of the heat is conducted to the third metal plate 145 through the package body 110 and is thereby radiated. At this point, because the thickness of a region at which the third metal plate 145 is formed is thin, the package body 110 can effectively conduct heat.

Figure 12:
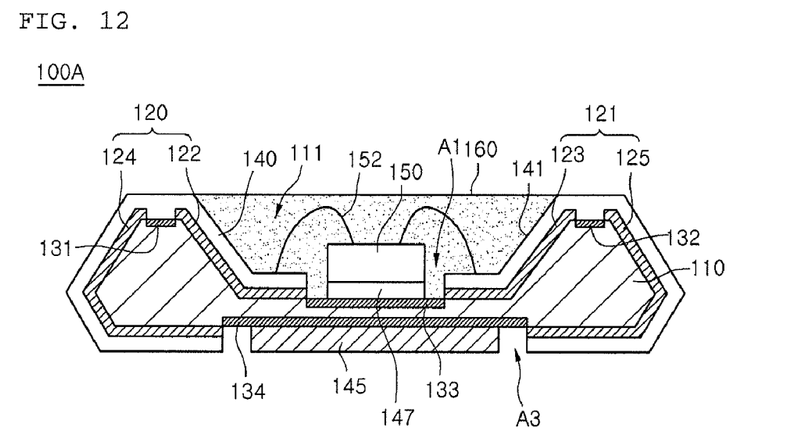
FIG. 12 is a side-sectional view illustrating a light emitting device package according to a second embodiment.
Figure 13A:
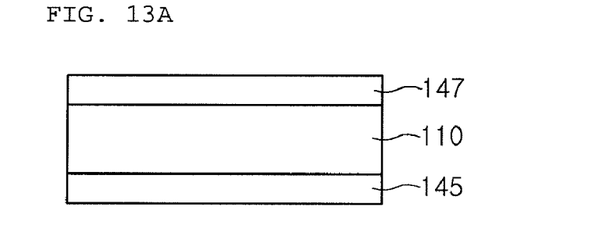
FIGS. 13A and 13B are diagrams respectively illustrating a heat-radiating path and a heat-radiating resistor corresponding to the light emitting device package in FIG. 12.
Figure 13B:
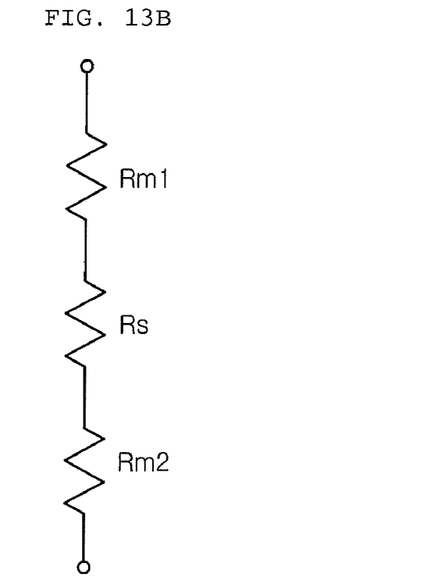

FIG. 12 is a side-sectional view illustrating a light emitting device package according to a second embodiment. FIGS. 13A and 13B are diagrams respectively illustrating the heat-radiating path and the heat-radiating resistor corresponding to the light emitting device package in FIG. 12. In the description of the second embodiment, repetitive description on the same elements as those of the first embodiment will be omitted and reference will be made to the first embodiment.

Referring to FIG. 12, in a light emitting device package 100A, a fourth metal plate 147 is formed on the third well 133 of the package body 110, and a third metal plate 145 is formed under the fourth well 134.

Heat radiated from the light emitting device 150, as illustrated in FIG. 13A, is radiated along the fourth metal plate 147, the package body 110 and the third metal plate 145.

The third and fourth metal plates 145 and 147 are electrically disconnected from the first and second metal plates 140 and 141. The size of the fourth metal plate 145 may be formed to be greater than the contact-surface area of the light emitting device 150, but is not limited thereto.

As illustrated in FIG. 13B, in the heat-radiating path of the light emitting device 150, heat is transferred through the fourth metal plate resistor Rm1, the package body resistor Rs and the third metal plate resistor Rm2. At this point, the fourth metal plate resistor Rm1 primarily diffuses and transfers the heat of the light emitting device 150.

Accordingly, because heat radiated from the light emitting device 150 is effectively radiated, the light emitting device 150 can stably operate, thereby improving the reliability of the light emitting device package.

Figure 14:
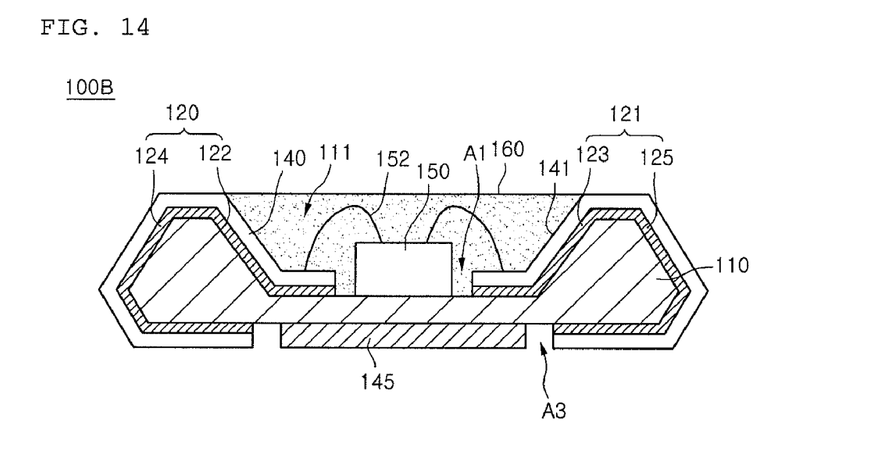
FIG. 14 is a side-sectional view illustrating a light emitting device package according to a third embodiment.
Figure 15A:
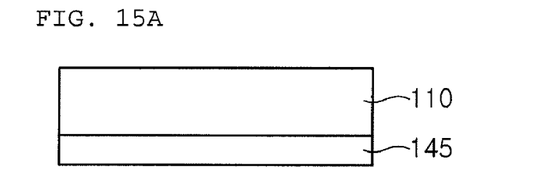
FIGS. 15A, 15B and 15C are diagrams respectively illustrating a heat-radiating path, a heat-radiating resistor and a circuit configuration corresponding to the light emitting device package in FIG. 14.
Figure 15B:
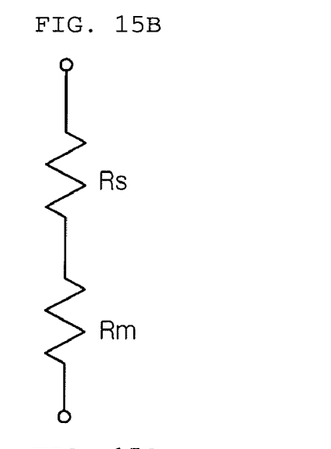
Figure 15C:
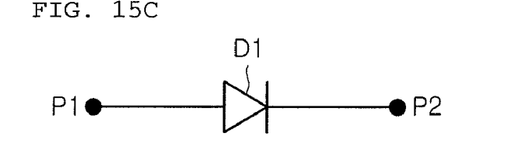

FIG. 14 is a side-sectional view illustrating a light emitting device package according to a third embodiment. FIGS. 15A, 15B and 15C are diagrams respectively illustrating a heat-radiating path, a heat-radiating resistor and a circuit configuration corresponding to the light emitting device package in FIG. 14. In description of the third embodiment, repetitive description on the same elements as those of the first embodiment will be omitted and reference will be made to the first embodiment.

Referring to FIG. 14, a light emitting device package 100B has a structure in which a well (or a doped region) is not formed at the package body 110. The light emitting device 150 is attached to the open region A1 of the bottom of the cavity 111 of the package body 110. The third metal plate 145 is formed at an under-surface open region A3.

Referring to FIG. 15A, in the heat-radiating path of the light emitting device 150, heat is radiated trough the third metal plate 145 via the package body 110. Referring to FIG. 15B, a heat-radiating resistor has a structure in which a package body resistor Rs and a third metal plate resistor Rm are connected. Referring to FIG. 15C, because a well is not formed from the package body 110, only a light emitting device D1 is included.

Figure 16:
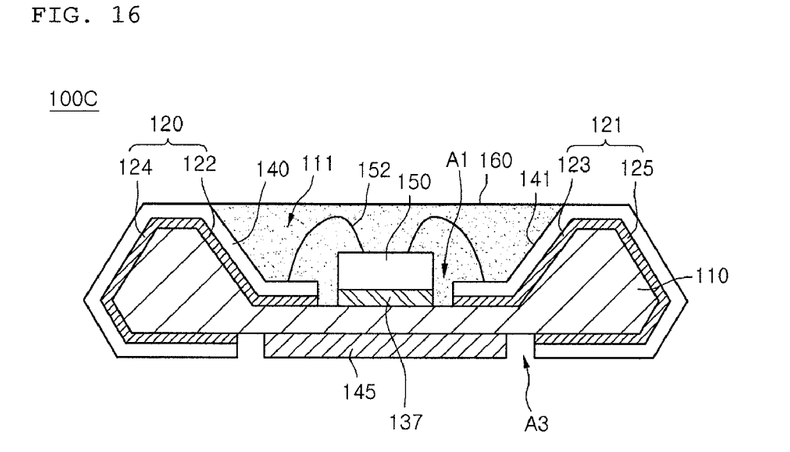
FIG. 16 is a side-sectional view illustrating a light emitting device package according to a fourth embodiment.
Figure 17A:
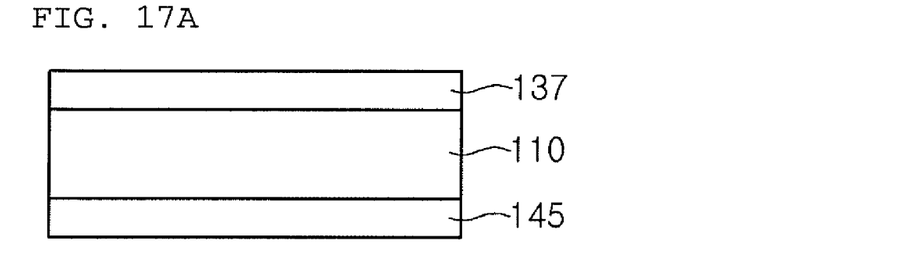
FIGS. 17A, 17B and 17C are diagrams respectively illustrating a heat-radiating path, a heat-radiating resistor and a circuit configuration corresponding to the light emitting device package in FIG. 16.
Figure 17B:
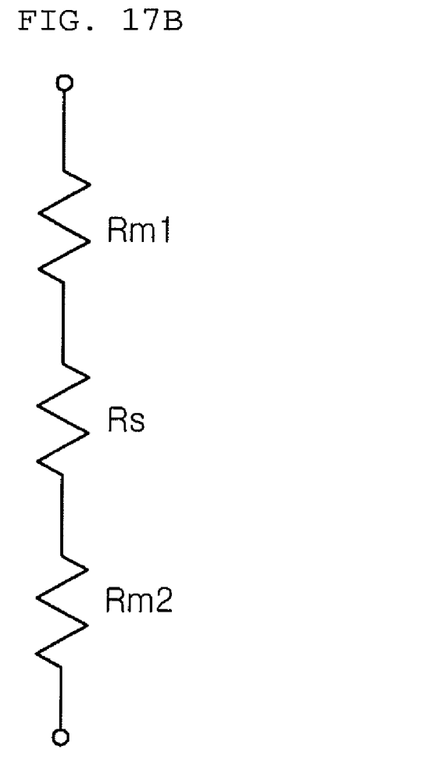
Figure 17C:
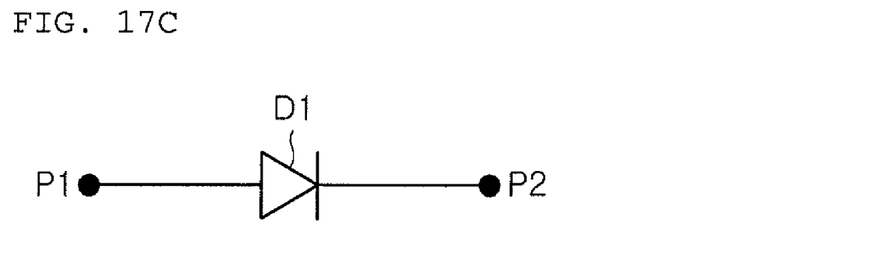

FIG. 16 is a side-sectional view illustrating a light emitting device package according to a fourth embodiment. FIGS. 17A, 17B and 17C are diagrams respectively illustrating a heat-radiating path, a heat-radiating resistor and a circuit configuration corresponding to the light emitting device package in FIG. 16. In description of the fourth embodiment, repetitive description on the same elements as those of the third embodiment will be omitted and reference will be made to the third embodiment.

Referring to FIG. 16, in a light emitting device package 100C, a fourth metal plate 137 is disposed under a light emitting device 150 and is disposed at the bottom of the cavity 111 of the package body 110. A third metal plate 145 is disposed at the under-surface open region A3 of the package body 110.

Referring to FIG. 17A, in a heat-radiating path, heat produced from the light emitting device 150 is radiated through the fourth metal plate 137, the package body 110 and the third metal plate 145. Referring to FIG. 17B, a heat-radiating resistor includes a fourth metal plate resistor Rm1, a package body resistor Rs and a third metal plate resistor Rm2. The heat is conducted trough the heat-radiating resistors Rm1, Rs and Rm2. Referring to FIG. 17C, the light emitting device package is configured with a circuit including a light emitting diode D1.

According to embodiments of the invention, a metal plate or/and a well is/are disposed at the cavity 111 of the package body 110, and a metal plate or/and a well is/are disposed at a surface opposite to this. Accordingly, radiant heat can be induced by the minimum number of resistors, and a protection device can be manufactured.

According to embodiments of the invention, the heat-transferring path of the light emitting device is improved in the semiconductor emitting device package, improving the light emission efficiency of the light emitting device.

According to embodiments of the invention, the light emitting device can be protected from an abnormal power source.

According to embodiments of the invention, heat radiation efficiency can improve by about 5% to about 20% in the semiconductor emitting device package.

According to embodiments of the invention, the reliability of the semiconductor emitting device package can improve.

An embodiment of the invention provides a method for manufacturing a light emitting device package including forming a cavity at a package body; forming an insulating layer at a surface of the package body; forming a plurality of metal layers on the insulating layer; forming a metal plate under the package body; attaching a light emitting device on the package body in the cavity; and electrically connecting the light emitting device to the metal layers.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
    a package body comprising a cavity disposed at an upper portion;
    an insulating layer disposed on a surface of the package body;
    at least one well formed in the package body;
    a plurality of metal layers disposed on the insulating layer;
    a light emitting device disposed on the package body in the cavity; and
    a first metal plate disposed on an under surface of the package body at a location corresponding to the light emitting device,
    wherein the insulating layer and the plurality of metal layers include a first open area on a bottom of the cavity,
    wherein a lower portion of the light emitting device is disposed in the first open area.

2. The light emitting device package according to claim 1, further comprising a second metal plate disposed between the light emitting device and the package body,
    wherein the second metal plate is disposed in the first open area and is spaced apart from the plurality of metal layers.

3. The light emitting device package according to claim 1, wherein the light emitting device is directly contacted on the bottom of the cavity of the package body, and the first metal plate is directly contacted on the under surface of the package body.

4. The light emitting device package according to claim 1, wherein the at least one well formed in the package body comprises:
    a first well comprising impurities, and being electrically connected to a first metal layer of the plurality of metal layers; and
    a second well comprising impurities, and being electrically connected to a second metal layer of the plurality of metal layers.

5. The light emitting device package according to claim 4, wherein the first and second wells constitutes a Zener diode connected to the light emitting device in anti-parallel.

6. The light emitting device package according to claim 4, wherein the package body further comprises a third well formed in at least one region of the package body corresponding to the first metal plate and the light emitting device.

7. The light emitting device package according to claim 6, wherein the third well is electrically opened with the first and second metal layers of the plurality of metal layers, and comprises impurities having a polarity different from a polarity of the package body.

8. The light emitting device package according to claim 1, further comprising at least one of a resin material formed at the cavity and a resin material to which a phosphor is included.

9. The light emitting device package according to claim 4, wherein:
the light emitting device comprises a colored Light Emitting Diode (LED) chip or an Ultraviolet (UV) LED chip, and
the package body is a silicon wafer or a conductive substrate.

10. A light emitting device package, comprising:
a package body comprising a cavity;
a plurality of metal layers disposed on the package body;
an insulating layer disposed between the plurality of metal layers and the package body;
at least one well formed in the package body;
a light emitting device disposed on the package body in the cavity; and
a first metal plate disposed under the package body at a region corresponding to the light emitting device,
wherein the insulating layer is disposed on a top surface and an under surface of the package body,
the insulating layer includes a first open area on a bottom of the cavity and a second open area on the under surface of the package body, and
wherein a lower portion of the light emitting device is disposed in the first open area and the first metal plate is disposed in the second open area.

11. The light emitting device package according to claim 10, further comprising a second metal plate disposed between the package body and the light emitting device.

12. The light emitting device package according to claim 10, wherein the at least one well comprises impurities, and a plurality of the wells being formed in the package body.

13. The light emitting device package according to claim 10, wherein the at least one well is formed in at least one of a region of the package body under the light emitting device and a region of the package body at the first metal plate.

14. The light emitting device package according to claim 10, wherein the first metal plate has an area greater than a bottom area of the light emitting device.

15. The light emitting device package according to claim 10, wherein the light emitting device and the first metal plate are disposed at opposite surfaces of the package body.

16. The light emitting device package according to claim 10, wherein the under surface of the package body and the first metal plate are disposed on the same plane.

17. The light emitting device package according to claim 10, wherein the at least one well and the light emitting device are electrically connected to the plurality of metal layers.

18. A light emitting device package, comprising:
a package body comprising a cavity, and formed of a silicon material;
an insulating layer disposed on a surface of the package body;
a first and second metal layers disposed on the insulating layer;
at least one light emitting device in the cavity of the package body; and
a first metal plate disposed at an under surface of the package body at a region corresponding to the light emitting device,
wherein the insulating layer includes a first open area on a bottom of the cavity,
wherein a lower portion of the light emitting device is disposed in the first open area, and
wherein the first and second metal layers are disposed on a surface of the cavity, and a top surface and an under surface of the package body.

19. The light emitting device package according to claim 18, wherein a thickness of the package body of the region is about 500 μm to about 2000 μm.

20. The light emitting device package according to claim 18, wherein the insulating layer includes a second open area at the under surface of the package body, and the first metal plate has a width narrower than that of the second open area at the under surface of the package body.

* * * * *